U S 0 0 7 9 1 5 6 2 9 B 2

US007915629B2

(12) United States Patent
Li et al.

(10) Patent No.: US 7,915,629 B2
(45) Date of Patent: Mar. 29, 2011

(54) COMPOSITE HIGH REFLECTIVITY LAYER

(75) Inventors: Ting Li, Ventura, CA (US); Monica Hansen, Santa Barbara, CA (US); James Ibbetson, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 121 days.

(21) Appl. No.: 12/316,097

(22) Filed: Dec. 8, 2008

(65) Prior Publication Data

US 2010/0140635 A1    Jun. 10, 2010

(51) Int. Cl.
*H01L 33/00* (2010.01)
(52) U.S. Cl. ............ 257/98; 257/E33.057; 257/E33.067
(58) Field of Classification Search .................... 257/98, 257/100, 79, 88, 91, 96, E33.067, E21.499, 257/E33.057, E33.001; 438/29, 22, 26, 47, 438/478, 106, 116
See application file for complete search history.

(56) References Cited

U.S. PATENT DOCUMENTS

| 4,946,547 | A | 8/1990 | Palmour et al. ............... 156/643 |
| 5,200,022 | A | 4/1993 | Kong et al. ................... 156/612 |
| RE34,861 | E | 2/1995 | Davis et al. ................... 437/100 |
| 6,552,369 | B2 | 4/2003 | Chiou et al. ................... 257/98 |
| 6,563,141 | B1 | 5/2003 | Dawson et al. ................ 257/98 |
| 6,643,305 | B2 * | 11/2003 | Bewley et al. ............ 372/45.01 |
| 6,657,236 | B1 | 12/2003 | Thibeault et al. .............. 257/98 |
| 6,784,462 | B2 * | 8/2004 | Schubert ....................... 257/98 |
| 6,833,565 | B2 | 12/2004 | Su et al. ........................ 257/98 |
| 6,967,981 | B2 | 11/2005 | Chua et al. ..................... 372/46 |
| 7,148,514 | B2 | 12/2006 | Seo et al. ....................... 257/79 |
| 7,261,454 | B2 | 8/2007 | Ng .............................. 362/555 |
| 7,622,746 | B1 * | 11/2009 | Lester et al. .................... 257/98 |
| 2006/0006402 | A1 | 1/2006 | Hsieh et al. |
| 2006/0081858 | A1 | 4/2006 | Lin et al. |
| 2006/0274805 | A1 * | 12/2006 | Song et al. ............... 372/50.124 |
| 2006/0292804 | A1 | 12/2006 | Seo et al. |
| 2007/0057273 | A1 * | 3/2007 | Yoo .................................. 257/99 |
| 2007/0145380 | A1 | 6/2007 | Shum et al. |

(Continued)

FOREIGN PATENT DOCUMENTS

KR    100 843 426    7/2008

(Continued)

OTHER PUBLICATIONS

CREE® EZ700™ LED Data Sheet, 2007 Cree's EZBright™.

(Continued)

*Primary Examiner* — Thomas L Dickey
*Assistant Examiner* — Nikolay Yushin
(74) *Attorney, Agent, or Firm* — Koppel, Patrick, Heybl & Dawson

(57) ABSTRACT

A high efficiency light emitting diode with a composite high reflectivity layer integral to said LED to improve emission efficiency. One embodiment of a light emitting diode (LED) chip comprises an LED and a composite high reflectivity layer integral to the LED to reflect light emitted from the active region. The composite layer comprises a first layer, and alternating plurality of second and third layers on the first layer, and a reflective layer on the topmost of said plurality of second and third layers. The second and third layers have a different index of refraction, and the first layer is at least three times thicker than the thickest of the second and third layers. For composite layers internal to the LED chip, conductive vias can be included through the composite layer to allow an electrical signal to pass through the composite layer to the LED.

51 Claims, 6 Drawing Sheets

U.S. PATENT DOCUMENTS

2008/0272391 A1 11/2008 Kapur

FOREIGN PATENT DOCUMENTS

WO WO 2007/115040 10/2007
WO WO 2007/121739 11/2007

OTHER PUBLICATIONS

CREE® EZ1000™ LEDs Data Sheet, 2007 Cree's EZBright™.
CREE® EZBright290™ LED Data Sheet, 2007 Cree's EZBright™.
CREE® EZ400™ LED Data Sheet, 2007 pp. 1-5 Cree's EZBright™.
Windisch et al. "Impact of Texture-Enhanced Transmission on High-Efficiency Surface-Textured Light-Emitting Diodes", Applied Physics Letters vol. 79, No. 15, Oct. 8, 2001, pp. 2315-2317.
Schnitzer et al. "30% External Quantum Efficiency From Surface Textured, Thin-Film Light-Emitting Diodes", 320 Applied Physics Letters 63(Oct. 18, 1993), No. 16, pp. 2174-2176.
Windisch et al. "Light-Extraction Mechanisms in High-Efficiency Surface-Textured Light-Emitting Diodes", IEEE Journal On Selected Topics in Quantum Electronics, vol. 8, No. 2, Mar./Apr. 2002, pp. 248-255.
Streubel, et al. "High Brightness AlGaInP Light-Emitting Diodes", IEEE Journal on Selected Topics in Quantum Electronics, vol. 8, No. 2 Mar./Apr. 2002, pp. 321-332.
Huang et al. "High-Performance GaN-Based Vertical-Injection Light-Emitting Diodes with $TiO_2$ -$SiO_2$ Omnidirectional Reflector and n-GaN Roughness", IEEE Photonics Technology Letters, vol. 19, No. 8, Apr. 15, 2007, pp. 565-567.
Djurisic A.B. et al., "Asymmetric Bragg Mirrors for the Reduction of Emission Wavelength Dependence on the Viewing Angle in Organic Microcavity Light Emitting Diodes", Optics Communications, North-Holland Publishing Co., vol. 236, No. 4-6, Jun. 15, 2004, pp. 303-311.
Tang, J.F.,et al., "Automatic Design of Optical Thin-Film Systems-Merit Function and Numerical Optimization Method", Journal of the Optical Society of America, USA, vol. 72, No. 11, Nov. 1982, pp. 1522-1528.
Annex to Form PCT/ISA/206 "Communication Relating to the Results of the Partial International Search" for counterpart application PCT/US2009/006447 mailed Apr. 8, 2010.
International Search Report and Written Opinion for counterpart application PCT/US2009/006447 mailed Jun. 17, 2010.

\* cited by examiner

REFLECTANCE (%) VS ANGLE (DEG)

COMPOSITE HIGH REFLECTIVITY LAYER

BACKGROUND OF THE INVENTION

1. Field of the Invention

This invention relates to light emitting diodes, and to light emitting diodes with a high reflectivity contact and method for forming the contact.

2. Description of the Related Art

Light emitting diodes (LED or LEDs) are solid state devices that convert electric energy to light, and generally comprise one or more active layers of semiconductor material sandwiched between oppositely doped n-type and p-type layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way that emission efficiency can be measured is by the emission intensity in relation to the input power, or lumens per watt. One way to maximize emission efficiency is by maximizing extraction of light emitted by the active region of LEDs. For conventional LEDs with a single out-coupling surface, the external quantum efficiency can be limited by total internal reflection (TIR) of light from the LED's emission region. TIR can be caused by the large difference in the refractive index between the LED's semiconductor and surrounding ambient. Some LEDs have relatively low light extraction efficiencies because the high index of refraction of the substrate compared to the index of refraction for the surrounding material, such as epoxy. This difference results in a small escape cone from which light rays from the active area can transmit from the substrate into the epoxy and ultimately escape from the LED package. Light that does not escape can be absorbed in the semiconductor material or at surfaces that reflect the light.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another LED package in which one or more LED chips 22 can be mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The metal reflector 24 may also experience optical losses when the light is reflected because it also has less than 100% reflectivity.

The reflectors shown in FIGS. 1 and 2 are arranged to reflect light that escapes from the LED. LEDs have also been developed having internal reflective surfaces to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 can reflect light emitted from the LED chip toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com).

FIG. 4 shows a graph 40 showing the reflectivity of Ag on gallium nitride (GaN) at different viewing angles for light with a wavelength of 460 nm. The refractive index of GaN is 2.47, while the complex refractive index for silver is taken from the technical literature. [See *Handbook of Optical Constants of Solids*, edited by E. Palik.] The graph shows the p-polarization reflectivity 42, s-polarization reflectivity 44, and average reflectivity 46, with the average reflectivity 46 generally illustrating the overall reflectivity of the metal for the purpose of LEDs where light is generated with random polarization. The reflectivity at 0 degrees is lower than the reflectivity at 90 degrees, and this difference can result in up to 5% or more of the light being lost on each reflection. In a LED chip, in some instances TIR light can reflect off the mirror several times before it escapes and, as a result, small changes in the mirror absorption can lead to significant changes in the brightness of the LED. The cumulative effect of the mirror absorption on each reflection can reduce the light intensity such that less than 75% of light from the LED's active region actually escapes as LED light.

SUMMARY OF THE INVENTION

The present invention discloses a higher reflectivity layer for use in LEDs and LED chips to increase emission efficiency. One embodiment of a light emitting diode (LED) chip according to the present invention comprises an active region between two oppositely doped layers. A composite high reflectivity layer is arranged to reflect light emitted from the active region. The composite layer comprises a first layer, one or more second layers, and a plurality of third layers on the first layer. The second layers have an index of refraction different from the third layers. The second and third layers alternate, and each of the third layers having different thicknesses compared to the other of the third layers. A reflective layer is included on the topmost of the second and third layers Another embodiment of an LED chip according to the present invention comprises a submount with an LED mounted to the submount. A composite high reflectivity layer is arranged between the submount and the LED to reflect LED light. The composite layer comprises a plurality of layers and a conductive path through the composite layer through which an electrical signal can pass to the LED.

Another embodiment of an LED chip according to the present invention comprises an LED and a composite high reflectivity layer integral to the LED to reflect light emitted from the active region. The composite layer comprises a first layer, and alternating plurality of second and third layers on the first layer. The second and third layers have a different index of refraction, and the first layer is at least three times thicker than the thickest of the second and third layers.

In still another embodiment of an LED chip according to the present invention comprises an LED and a composite high reflectivity layer integral to the LED to reflect light emitted from the LED. The composite layer comprising a first layer, and one or more second layers and a plurality of third layers on the first layer, with the second and third layers comprising incomplete second and third layer pairs.

These and other aspects and advantages of the invention will become apparent from the following detailed description and the accompanying drawings, which illustrate by way of example the features of the invention.

DETAILED DESCRIPTION OF THE INVENTION

Figure 1:
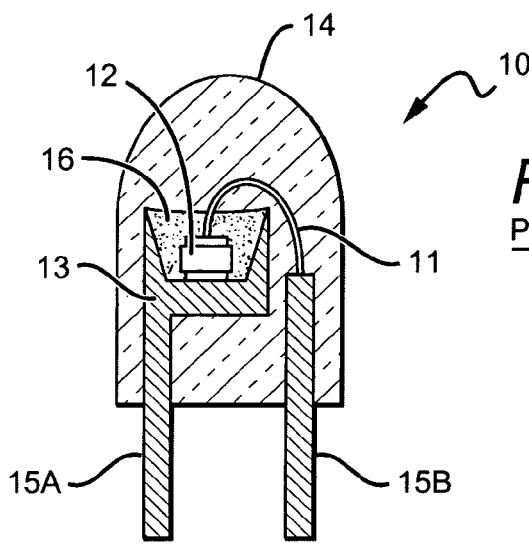
FIG. 1 is a sectional view of one embodiment of a prior art LED lamp.
Figure 2:
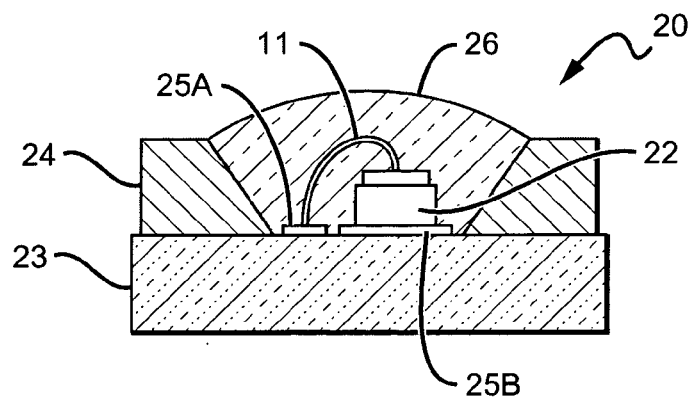
FIG. 2 is a sectional view of another embodiment of a prior art LED lamp.
Figure 3:
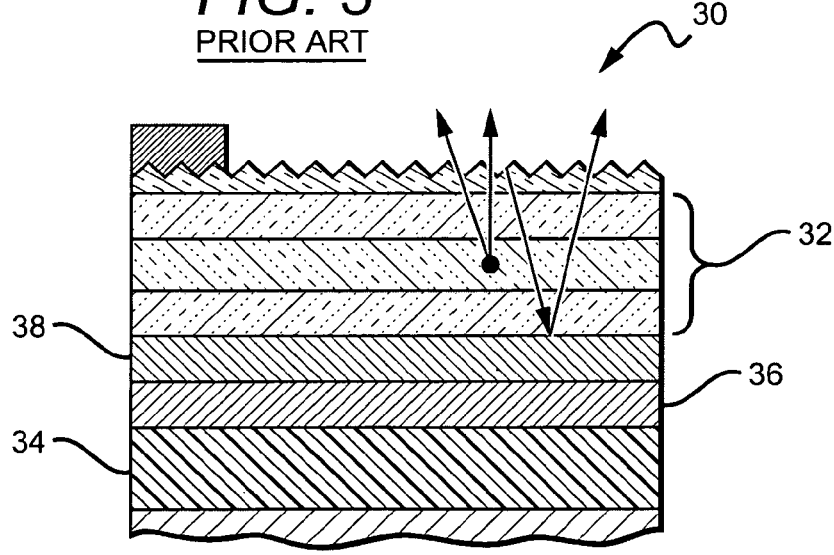
FIG. 3 is a sectional view of another embodiment of a prior art LED chip.
Figure 4:
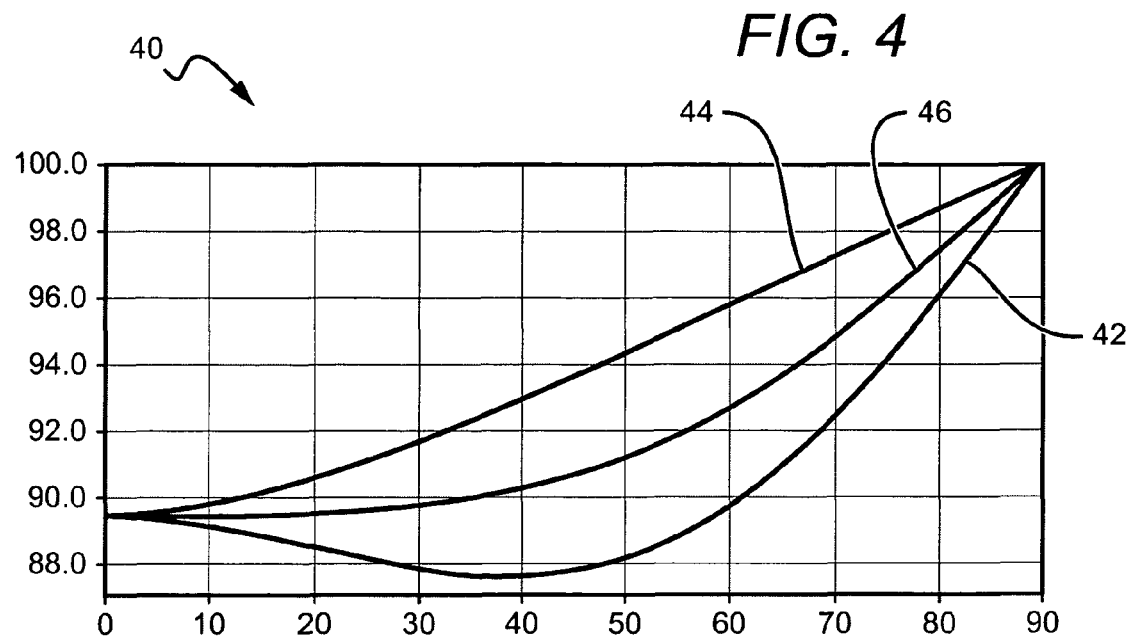
FIG. 4 is a graph showing the reflectivity of a metal reflector at different viewing angles.

The present invention is directed to solid-state emitters and methods for fabricating solid-state emitters having one or more composite high reflectivity contacts or layers arranged to increase emission efficiency of the emitters. The present invention is described herein with reference to light emitting diodes (LED or LEDs) but it is understood that it is equally applicable to other solid-state emitters. The present invention can be used as a reflector in conjunction with one or more contacts, or can be used as a reflector separate from the contacts.

The improved reflectivity of the composite contact/layer ("composite layer") reduces optical losses that can occur in reflecting light that is emitted from the active region in a direction away from useful light emission, such as toward the substrate or submount, and also to reduce losses that can occur when TIR light is reflecting within the LED. Embodiments of the present invention provide various unique combinations of layers that can comprise a composite layer. In one embodiment according to the present invention, the composite layer can comprise a first relatively thick layer, with second and third layers having different indices of refraction and different thickness, and a reflective layer. The composite layer can be in many different locations such as on an outer surface of the LED or internal to the LED.

Different embodiments of the invention also provide composite layers having conductive via or path arrangements that provide conductive paths through the composite layer. This allows an electric signal to pass through the composite layer along the vias so that the composite layer can be used as an internal layer, where an electrical signal passes through the composite layer during operation. This via arrangement can take many different shapes and sizes as described in detail below.

The present invention is described herein with reference to certain embodiments but it is understood that the invention can be embodied in many different forms and should not be construed as limited to the embodiments set forth herein. In particular, the composite layer can comprise many different layers of different material with many different thicknesses beyond those described herein. The composite layer can be in many different locations on different solid-state emitters beyond those described herein. Further, the composite layer can be provided with or without conductive structures to allow electrical signals to pass through.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 5A:
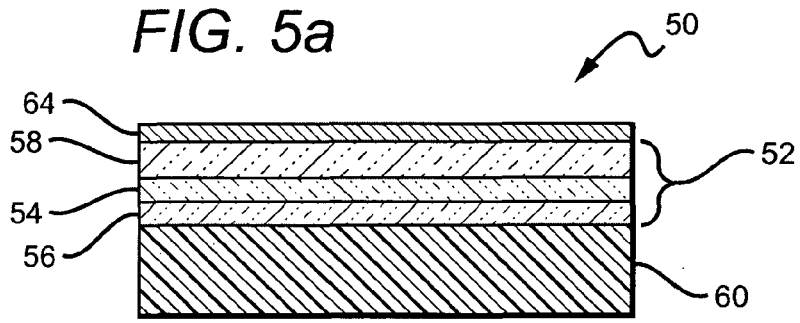
FIG. 5a is a sectional view of one embodiment of an LED chip at a fabrication step in one method according to the present invention.
Figure 5B:
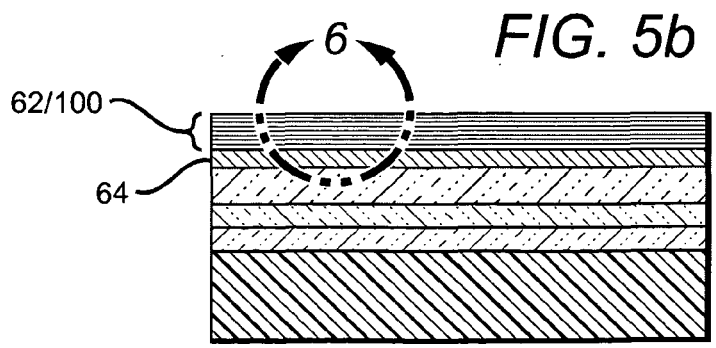
FIG. 5b is a sectional view of the LED chip in FIG. 5a at a subsequent fabrication step.

FIGS. 5a and 5b show one embodiment of an LED chip 50 according to the present invention, and although the present invention is described with reference to fabrication of a single LED chip it is understood that the present invention can also be applied to wafer level LED fabrication, fabrication of groups of LEDs, or fabrication of packaged LED chips. The wafer or groups of LEDs can then be separated into individual LED chips using known singulation or dicing methods. This embodiment is also described with reference to an LED chip having vertical geometry arrangement and that is flip chip mounted. As further described below the present invention can be used with other LED arrangements, such as lateral geometry LEDs and non flip-chip orientations.

The LED chip 50 comprises an LED 52 that can have many different semiconductor layers arranged in different ways. The fabrication and operation of LEDs is generally known in the art and only briefly discussed herein. The layers of the LED 52 can be fabricated using known processes with a suitable process being fabrication using MOCVD. The layers of the LED 52 generally comprise an active layer/region 54 sandwiched between n-type and p-type oppositely doped epitaxial layers 56, 58, all of which are formed successively on a growth substrate 60. It is understood that additional layers and elements can also be included in the LED 52, including but not limited to buffer, nucleation, contact and current spreading layers as well as light extraction layers and elements. The active region 54 can comprise single quantum well (SQW), multiple quantum well (MQW), double heterostructure or super lattice structures.

The active region 54 and layers 56, 58 can be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers 56, 58 are gallium nitride (GaN) and the active region 54 comprises InGaN. In alternative embodiments the n- and p-type layers 56, 58 may be AlGaN, aluminum gallium arsenide (AlGaAs) or aluminum gallium indium arsenide phosphide (AlGaInAsP) and related compounds.

The growth substrate 60 can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III-nitrides than sapphire and results in Group III-nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

Different embodiments of the LED 52 can emit different wavelengths of light depending on the composition of the active region 54 and n- and p-type layer 56, 58. In the embodiment shown, the LED 50 emits a blue light in the wavelength range of approximately 450 to 460 nm. The LED chip 50 can also be covered with one or more conversion materials, such as phosphors, such that at least some of the light from the LED passes through the one or more phosphors and is converted to one or more different wavelengths of light. In one embodiment, the LED chip emits a white light combination of light from the LED's active region and light from the one or more phosphors.

In the case of Group-III nitride devices, current typically does not spread effectively through the p-type layer 58 and it is known that a thin current spreading layer 64 can cover some or the entire p-type layer 58. The current spreading layer helps spread current from the p-type contact across the surface of the p-type layer 58 to provide improved current spreading across the p-type layer with a corresponding improvement in current injection from the p-type layer into the active region. The current spreading layer 64 is typically a metal such as platinum (Pt) or a transparent conductive oxide such as indium tin oxide (ITO), although other materials can also be used. The current spreading layer can have many different thicknesses, with one embodiment of an ITO spreading layer a thickness of approximately 115 nm. The current spreading layer 64 as well as the layers that comprise the composite layer described below can be deposited using known methods. It is understood that in embodiments where current spreading is not a concern, the composite layer can be provided without a current spreading layer.

Referring now to FIG. 5b, a composite high reflectivity layer 62 can be deposited on the p-type layer 58, and in the embodiment shown the current spreading layer is between the reflectivity layer 62 and the p-type layer. The composite layer 62 according to the present invention has higher reflectivity to the wavelength of light generated by the LED 52 compared to standard metal contacts or distributed Bragg reflectors (DBRs). The composite layer generally comprises a thick layer of material followed by a plurality of thinner layers that combine to provide improved reflectivity. The present invention provides a composite layer with the desired reflectivity that also minimizes the number of layers to minimize the manufacturing complexities and cost.

Figure 6:
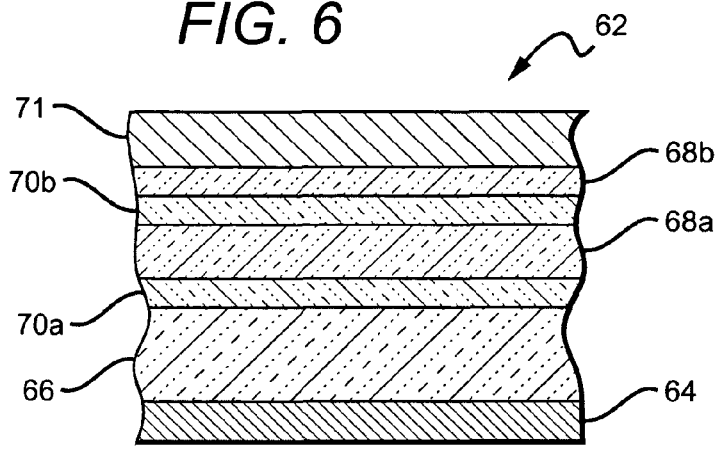
FIG. 6 is a sectional view of one embodiment of composite layer according to the present invention.

Referring now to FIG. 6, the different layers that can comprise one embodiment of a composite layer according to the present invention are shown, but it is understood that many different materials, thicknesses and number of layers can also be used. A first layer 66 of the composite layer is provided on the current spreading layer 64, and the first layer can comprise many different materials, with the preferred material comprising a dielectric. Different dielectric materials can be used such as a SiN, $SiO_2$, Si, Ge, MgOx, MgNx, ZnO, SiNx, SiOx, alloys or combinations thereof, with the material in first layer 66 in the embodiment shown comprising $SiO_2$. This first layer 66 should be relatively thick to provide a reliable viewing angle cut-off point after which the reflectivity of the composite layer is approximately 100%, and in one embodiment used with a blue emitting LED the first layer 66 can have a thickness in the range of 500 to 650 nm, with one embodiment having a thickness of approximately 591 nm.

Figure 7:
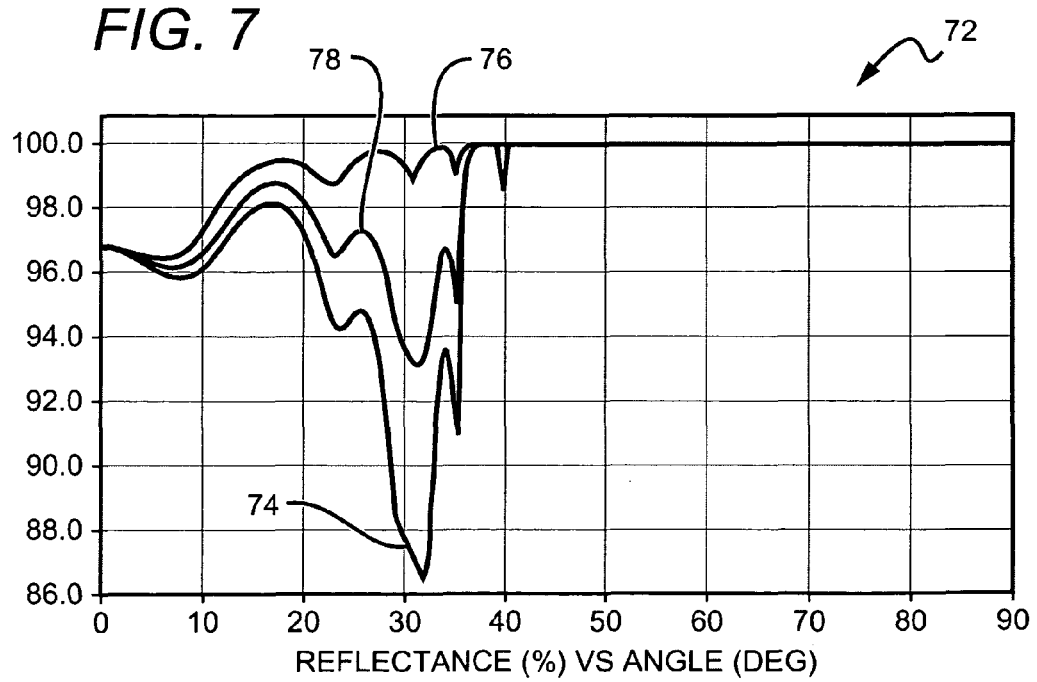
FIG. 7 is a graph showing the reflectivity of a composite layer according to the present invention.

Referring now to the graph 72 in FIG. 7, which shows the p-polarization reflectivity 74, s-polarization reflectivity 76, and average reflectivity 78 at different viewing angles for a first layer 66 having a thickness in the range of 500 to 650 nm for blue wavelengths of light. The viewing angle cut-off is at a viewing angle of approximately 36 degrees. That is, the reflectivity of the composite layer 62 is approximately 100% at viewing angles greater than approximately 36 degrees, and below this viewing angle the reflectivity can be as low as 94% at certain viewing angles.

Referring again to FIG. 6, to improve reflectivity at lower viewing angles and to improve the angle averaged reflectivity (AAR), the composite layer 62 can also comprise second layers 68a, 68b and third layers 70a, 70b with the second and third layers being made of materials with differing indexes of refraction. In different embodiments different materials can be used for the layers and a different number of layers can be included, with the embodiment shown having two second layers 68a-b comprising $SiO_2$ and two third layers 70a-b comprising $TiO_2$. $SiO_2$ has an index of refraction of 1.46, while $TiO_2$ has an index of refraction of 2.34. The two $SiO_2$ layers can have different thicknesses and the two $TiO_2$ layers can have different thicknesses, which provide a composite layer that is different from standard DBRs where the layers of different materials have the same thickness. One such example of this type of DBR is a ¼ wavelength DBR where each of the second and third $SiO_2$ and $TiO_2$ layers can have essentially the same optical thickness approximately equal to a ¼ wavelength of the light. In other embodiments of the composite layer, $Ta_2O_5$ can be used in place of $TiO_2$.

For the composite layer embodiment shown that is used in conjunction with a blue emitting LED, the second layers 68a-b can have thicknesses in the range of 100 to 120 nm, and approximately 40 to 60 nm respectively, with one embodiment of the second layers being approximately 108 nm and 53 nm thick. The third $TiO_2$ layers 70a-b can have thicknesses in the range of 55 to 75 nm and 35 to 55 nm, respectively, with one embodiment having thicknesses of approximately 65 nm and 46 nm respectively.

The composite layer 62 can also comprise a reflective layer 71 on the second layer 68b, deposited using known methods such as sputtering. The reflective layer 71 can have many different thicknesses and can comprise many different reflective materials, with suitable materials being Ag, Al and Au. The choice of material can depend on many factors with one being the wavelength of light being reflected. In the embodiment shown reflecting blue wavelengths of light, the reflective layer can comprise Ag having a thickness of approximately 200 nm. In other embodiments the reflective layer 71 can comprise composite metal layers such as TiAg, NiAg, CuAg or PtAg, and in some embodiments these composite layers can provide improved adhesion to the layer it is formed on, such as the second layer 68b. Alternatively, a thin layer of material such as indium tin oxide (ITO), Ni, Ti or Pt can be included between the second layer 68b and the reflective layer to also improve adhesion.

The structure of the composite layer 62 provides improved AAR compared to standard ¼ wavelength DBRs. Although there may be a number of reasons why this arrangement provides this improvement, it is believed that one reason is that the different thicknesses of the second layers 68a,68b and the third layers 70a,70b present differently to light at various incident angles. That is, light will reach composite layer 62 at many different angles, and at these different angles the second layers 68a, 68b and third layers 70a, 70b can appear as different thicknesses, such as multiples of a ¼ wavelength thickness depending on the angle. It is believed that the different thicknesses provide the best overall AAR across viewing angles of 0-90 degrees.

Figure 8:
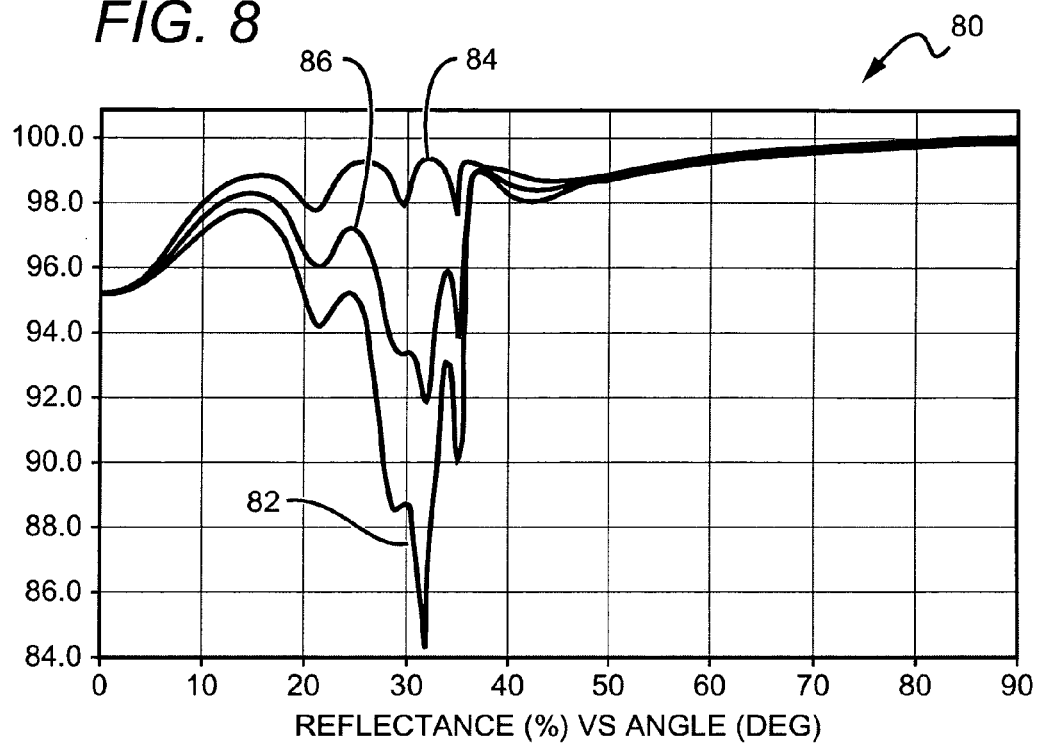
FIG. 8 is a graph showing the reflectivity of a composite layer according to the present invention.

FIG. 8 is a graph 80 showing the reflectivity of a composite layer similar to that shown in FIG. 6, and shows the p-polarization reflectivity 82, s-polarization reflectivity 84, and average reflectivity 86 at different viewing angles. In this case, the reflectivity includes the effect of an ITO current spreading layer 64 having a thickness of 115 nm and finite absorption coefficient of 500/cm, which results in the reflectivity approaching but being slightly below 100% at viewing angles greater than approximately 36 degrees. The AAR across viewing angles of 0-90 degrees for the composite layer shown is approximately 98.79%, which provides an improvement over a standard DBR with a similar number of layers made of the same materials. At certain wavelengths of light the AAR of a standard ¼ wavelength DBR can be approximately 98.73% or less. This difference can have a significant impact on overall LED brightness because light can reflect off the composite layer multiple times before escaping from the LED. This compounding effect of multiple reflections amplifies even small differences in reflectivity.

Figure 9:
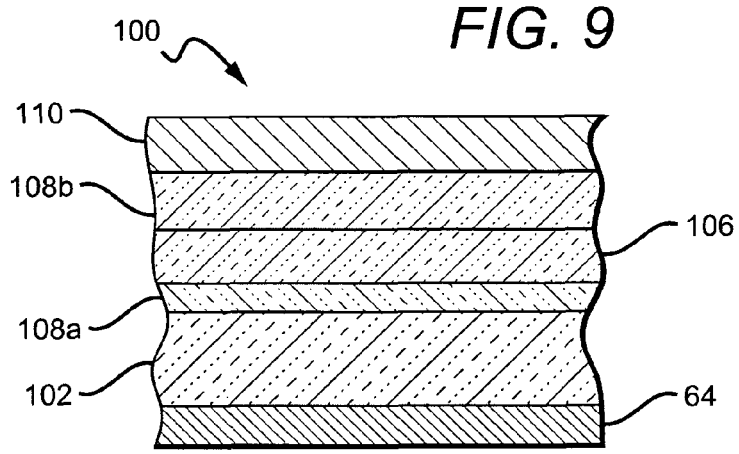
FIG. 9 is a sectional view of another embodiment of a composite layer according to the present invention.

FIG. 9 shows another embodiment of the composite layer 100 that is similar to composite layer 62 described above and can be used with a blue emitting LED. The composite layer 100 can have four layers instead of five. In this embodiment the first layer 102 is on a current spreading layer 64, although it is understood that the composite layer 100 can be used without a current spreading layer. The first layer 102 is similar to the first layer 66 described above and can be made of many materials and many different thicknesses. In the embodiment shown the first layer 102 can comprise $SiO_2$ with thickness in the range of 500 to 650 nm, with one embodiment having a thickness of approximately 591 nm.

In this embodiment, the composite layer 100 comprises only one second layer 106 sandwiched between two third layers 108a-b. Like the embodiment above. That is, there are not an equal number of alternating second layers and third layers as in composite layer 62 described above, and as in conventional DBRs. This results in second and third layers combinations that comprise incomplete pairs or that are asymmetric. In embodiments with incomplete second and third layer pairs can comprise different numbers of each layer such as two second layers and three third layers, three second layers and four third layers, etc.

The second and third layers 106, 108a-b can comprise many different materials and can have many different thicknesses. In the embodiment shown, the second layer 106 can comprise $SiO_2$ and can have a thickness in the range of approximately 100 to 120 nm, with one embodiment having a thickness of 107 nm. The third layers 108a-b can comprise $TiO_2$ and can have thicknesses of in the range of 45 to 65 nm and 65 to 85 nm respectively, with one embodiment having third layer thicknesses of approximately 56 and 75 nm, respectively. The composite layer 100 can also comprise a reflective layer 110 on the third layer 108b that can be deposited using known methods and can comprise the same materials as reflective layer 71 described above.

By having an asymmetric arrangement, the composite layer can have fewer layers with the corresponding reduction in manufacturing steps and costs. This can also provide the additional advantage of better adhesion to subsequent layers, such as a reflective layer 110. In this embodiment the top layer comprises third layer 108b, which is $TiO_2$. This material can provide improved adhesion to reflective metals compared to the second layer 106 comprising $SiO_2$ The composite layer 100, however, can have a reduced AAR compared to a six-layer arrangement shown in FIG. 6, with the AAR of one embodiment of a five-layer arrangement as shown in FIG. 9 being approximately 98.61%. This, however, represents an improvement over a standard five layer DBR where the AAR can be approximately 96.61%. Similar to the six-layer embodiment above, this difference can have a significant impact on overall LED brightness because of the compounding effect of multiple reflections.

It is understood that composite layers according to the present invention can have many different layers of different materials and thicknesses. In some embodiments the composite layer can comprise layers made of conductive materials such as conductive oxides. The conductive oxide layers can have different indices of refraction and the differing thicknesses to provide the improved reflectivity. The different embodiments can have different arrangements of complete and incomplete pairs of second and third layers. It is also understood that the composite layer can be arranged in different locations on an LED and can comprise different features to provide thermal or electrical conduction through the composite layer.

Figure 10A:
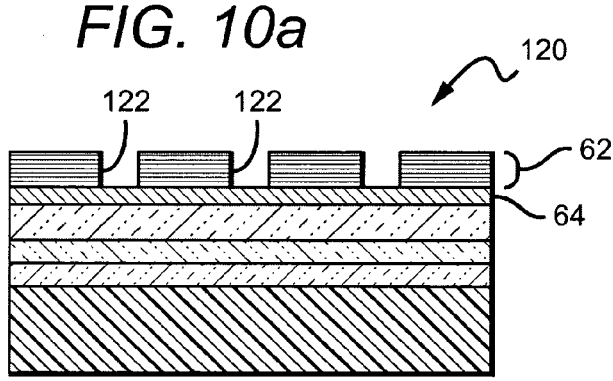
FIG. 10a is a sectional view of another embodiment of an LED according to the present invention.

Referring now the FIGS. 10a through 10d, another embodiment of an LED 120 having many of the same features as LED 50 shown in FIGS. 5a and 5b and for those same features the same reference numbers will be used. The LED 50 is fabricated such that is can be arranged in a flip-chip orientation, so for this embodiment the end LED chip will have the composite layer 62 (or composite layer 100) arranged as an internal layer as further described below. Accordingly, an electric signal should pass through the composite layer 62. Referring now to FIG. 10a and FIG. 11, holes 122 can be formed through the composite layer 62 at random or regular intervals, with the holes sized and positioned so that a conductive material can be deposited in the holes to form conductive vias. In the embodiment shown the holes 122 are at regular intervals.

In different embodiments having a current spreading layer 64, the holes 122 may or may not pass through the current spreading layer 64. The holes 122 can be formed using many known processes such as conventional etching processes or mechanical processes such as microdrilling. The holes 122 can have many different shapes and sizes, with the holes 122 in the embodiment shown having a circular cross-section with a diameter of approximately 20 microns. Adjacent holes 122 can be approximately 100 microns apart. It is understood that the holes 122 (and resulting vias) can have cross-section with different shapes such as square, rectangular, oval, hexagon, pentagon, etc. In other embodiments the holes are not uniform size and shapes and there can be different spaces between adjacent holes.

Figure 11:
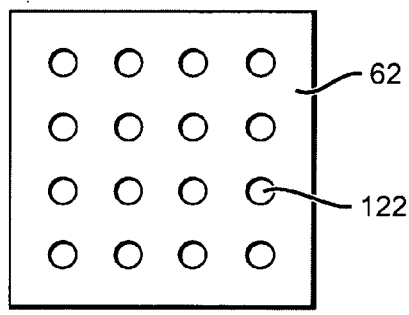
FIG. 11 is a plan view of one embodiment of a composite layer according to the present invention.
Figure 12:
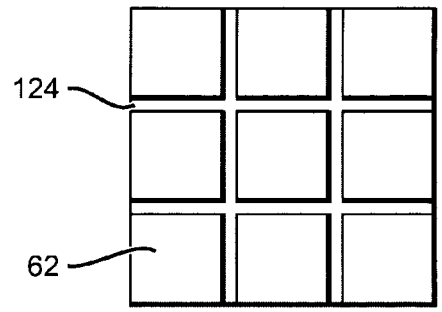
FIG. 12 is a plan view of another embodiment of a composite layer according to the present invention.

Referring now to FIG. 12, instead of holes an interconnected grid 124 can be formed through the composite layer 62, with a conductive material then being deposited in the grid 124 to form the conductive path through the composite layer. The grid 124 can take many different forms beyond that shown in FIG. 11, with portions of the grid interconnecting at different angles in different embodiment. An electrical signal applied to the grid 124 can spread throughout along the interconnected portions. It is further understood that in different embodiments a grid can be used in combination with holes.

Figure 10B:
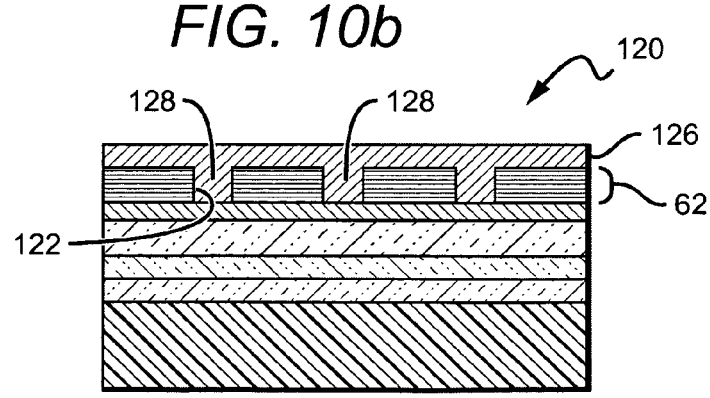
FIG. 10b is a sectional view of the LED in FIG. 10a at a subsequent fabrication step.

Referring now to FIG. 10b, a conductive layer 126 can be deposited on the composite layer 62 covering its reflective layer and filling the holes 122 to form vias 128 through the composite layer 62. In other embodiments, the conductive layer can cover less than all of the composite layer 62. The conductive layer 126 can comprise many different materials such as metals or conductive oxides, both of which can be deposited using known techniques.

Figure 10C:
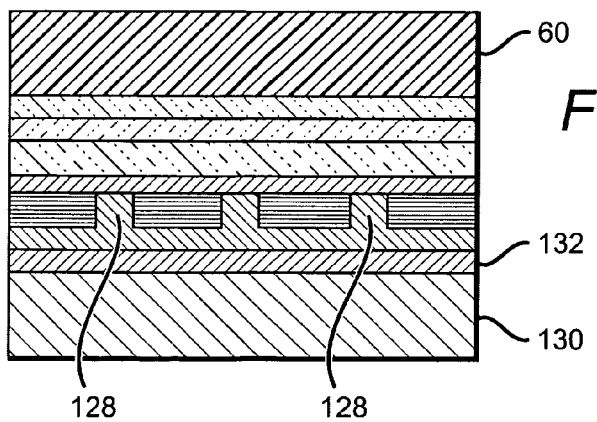
FIG. 10c is a sectional view of the LED in FIG. 10b at a subsequent fabrication step.

Referring now to FIG. 10c, the LED 120 (FIGS. 10a and 10b) can be flip-chip mounted to a submount 130 using known mounting techniques. In the embodiment shown, the LED 50 is flip-chip mounted to the submount by a conductive bond material 132. It is understood that in embodiments where the LEDs chips 120 are formed at the wafer level and then singulated, the LEDs chips 120 can be wafer bonded to the submount 130 using known wafer bonding techniques. The submount 130 can be made of many different materials and can have many different thicknesses, with the preferred submount 130 being electrically conductive so that an electrical signal can be applied to the active region of the LED through the submount 130. The signal also passes through the composite layer along conductive vias 128.

Figure 10D:
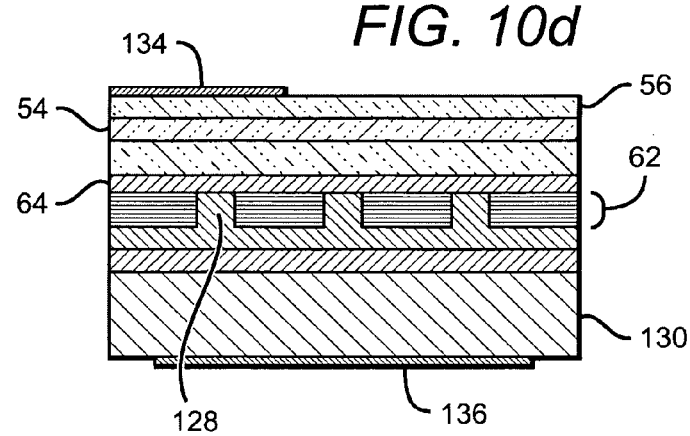
FIG. 10d is a sectional view of the LED in FIG. 10c at a subsequent fabrication step.

Referring now to FIG. 10d, the growth substrate 60 (as shown in FIG. 10c) can be removed using known grinding and/or etching processes. A first contact 134 can be deposited on the n-type layer 56 and a second contact 136 can be deposited on the submount 130. The first and second contacts 134, 136 can comprise many different materials such as Au, copper (Cu) nickel (Ni), indium (In), aluminum (Al), silver (Ag), or combinations thereof. In still other embodiments the first and second contacts can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. The top surface of the n-type layer 56 can be textured or shaped such as by laser texturing, mechanical shaping, etching (chemical or plasma), scratching or other processes, to enhance light extraction.

During operation, an electrical signal is applied to the LED 50 across first and second contacts 134, 136. The signal on the first contact 134 spreads into the n-type layer 56 and to the active region 54. The signal on the second contact 136 spreads into the submount 130, through composite layer 62 along the vias 128, through the current spreading layer 64, into the p-type layer 58 and to the active region 54. This causes the active region 54 to emit light and the composite layer 62 is arranged to reflect light emitted from the active region toward the submount 128, or reflected by TIR toward the submount 130, back toward the top of the LED chip 50. The composite layer 62 encourages emission toward the top of the LED chip 50 and because of its improved reflectivity, reduces losses that occur during reflection.

Figure 13A:
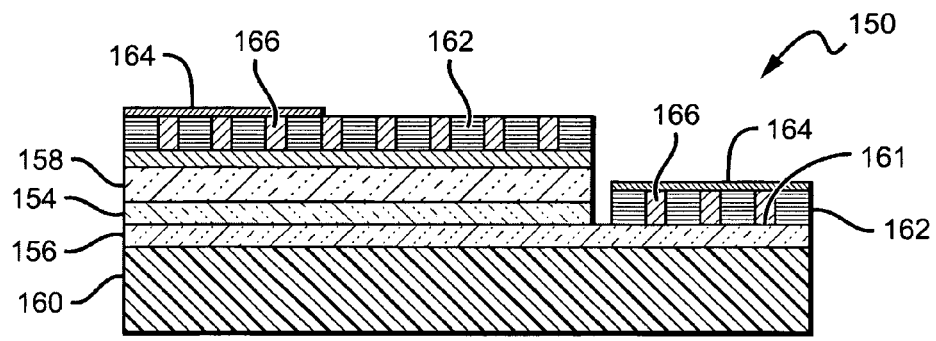
FIG. 13a is a sectional view of another embodiment of an LED chip according to the present invention.
Figure 13B:
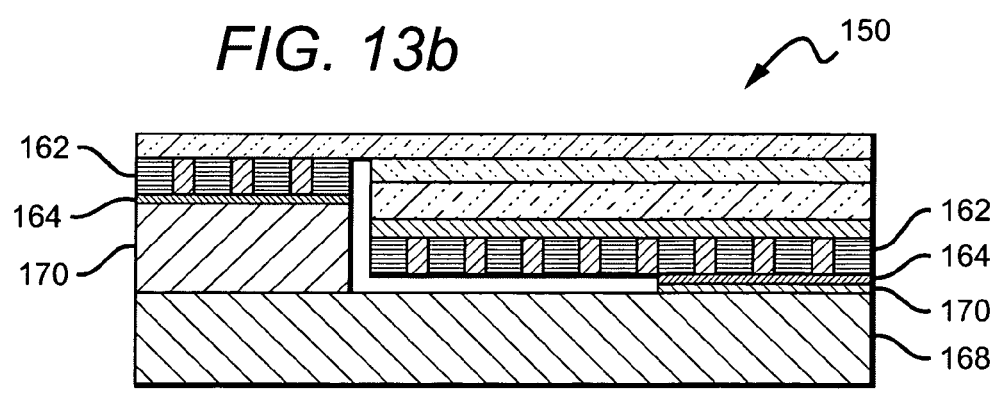
FIG. 13b is a sectional view of the LED chip shown in FIG. 13a at a subsequent fabrication step.

It is understood that the composite layers can be used in many different ways and in many different locations on LEDs, LED chips, and other solid-state emitters. As shown in FIGS. 13a and 13b, the composite layers can be used in conjunction with a lateral geometry LED chip 150 where both contacts are on one side of the LEDs. The layers of the LED 150 are generally the same as those for LED chip 50 and can comprise an active layer/region 154 sandwiched between n-type and p-type oppositely doped epitaxial layers 156, 158, all of which are formed successively on a growth substrate 160. For lateral geometry LEDs, a portion of the p-type layer 158 and active region 154 is removed, such as by etching, to expose a contact mesa 161 on the n-type layer 156. In this embodiment, a composite layer 162 similar to the composite layer 62 described above can be included on both the surface of the n-type layer 156 and the surface of the p-type layer 158, with the composite layer having a metal layer 164 and conductive vias 166 similar to the metal layer 126 and vias 128 described above.

Referring now to FIG. 13b, the LED chip 150 can be flip-chip mounted to a submount 168 using known mounting processes preferably by conductive bonds 170 to the metal layers 164 on the composite layers 162. An electrical signal from the submount 168 is applied to the LED through the conductive bonds 170, and composite layers 162, causing the LED chip to emit light. The composite layers 162 reflect light that is directed toward the submount 168 to reflect back toward the emission surface of the LED chip 150. The improved reflectivity of the composite layers 162 reduces reflectivity losses and improves overall emission efficiency of the LED chip 150.

Figure 14:
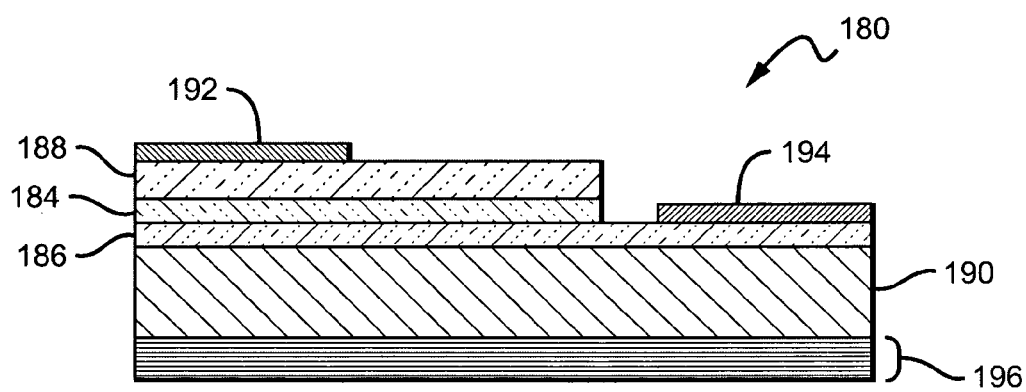
FIG. 14 is a sectional view of another embodiment of an LED chip according to the present invention.

FIG. 14 shows still another embodiment of LED 180 according to the present invention also having an active layer/region 184 sandwiched between n-type and p-type oppositely doped epitaxial layers 186, 188, all of which are formed successively on a growth substrate 190. A portion of the p-type layer 188 and active region 184 is removed, such as by etching, to expose a contact mesa on the n-type layer 186. In this embodiment, p- and n-type contacts 192, 194 are deposited on the p-type layer 188 and the contact mesa of the n-type 186, and a composite layer 196 can be included on the bottom surface of the substrate 190.

In this embodiment, an electrical signal is not applied to the LED through the composite layer 196. Instead, the electrical signal is applied through the p- and n-type contacts 192, 194 where it spreads laterally to the active region 184. As a result, an electrical signal does not need to pass through the composite layer 196 and the composite layer 196 does not need electrically conductive vias. Instead, an uninterrupted composite layer can be included across the substrate bottom surface to reflect light emitted from the active region toward the substrate and TIR light that reflects toward the substrate. It is understood that in different embodiments the composite layer can also cover all or part of the side surfaces of the LED 180, and a composite layer can be used in with the n- and p-type contacts 192, 194 to improve their reflectivity.

It is also understood that a composite layer can also be used on the bottom surface of submounts in flip-chip embodiments where the submounts are transparent. In these embodiments the desired reflectivity can be achieved without having internal composite layers 162 as shown in FIG. 13b.

Figure 15:
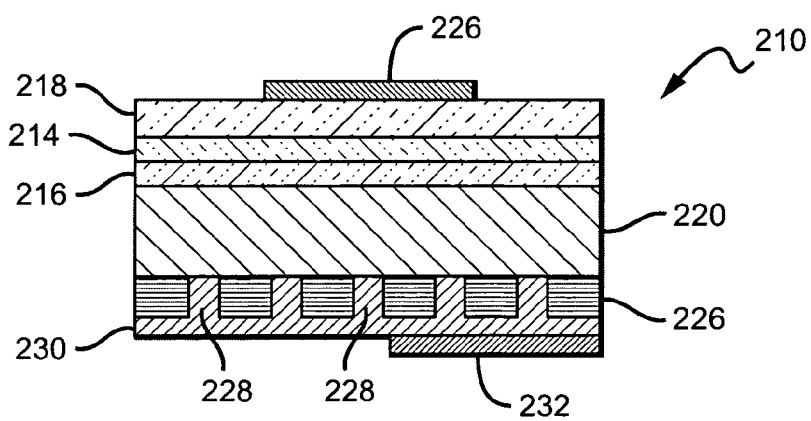
FIG. 15 is a sectional view of still another embodiment of an LED chip according to the present invention.

FIG. 15 shows still another embodiment of an LED chip 210 having an active layer/region 214; n-type and p-type oppositely doped epitaxial layers 216, 218, all of which are formed successively on a growth substrate 220. LED 210 has vertical geometry with a p-type contact 224 on the p-type layer 218. A thin semitransparent current spreading layer (not shown) can cover some or the entire p-type layer 218, which is typically a metal such as Pt or a transparent conductive oxide such as ITO, although other materials can also be used. A composite layer 226 is included on the substrate 220 and, because the LED 210 has vertical geometry, an electrical signal can be applied to the LED through the composite layer 226. The composite layer comprises conductive vias 228 similar to those described above that allow an electrical signal to pass through the composite layer 226. The composite layer 226 can also comprise a metal layer 230 with an n-type contact 232 on the metal layer. This embodiment is particularly applicable to LEDs having electrically conductive substrates and an electrical signal applied to the p-type 224 and n-type contact 232 spreads to the LED active region 214 causing it to emit light. It is also understood that a composite layer can be included with the p-type contact to improve its reflectivity.

In different embodiments of the present invention the vias can serve additional purposes beyond conducting electrical signals. In some embodiments the vias can be thermally conductive to assist in thermal dissipation of heat generated by the LED. Heat can pass away from the LED through the vias where it can dissipate.

Although the present invention has been described in detail with reference to certain preferred configurations thereof, other versions are possible. Therefore, the spirit and scope of the invention should not be limited to the versions described above.

We claim:

1. A light emitting diode (LED) chip, comprising:
    an active region between two oppositely doped layers;
    a composite high reflectivity layer arranged to reflect light emitted from said active region, said composite layer comprising:
        a first layer;
        one or more second layers and a plurality of third layers on said first layer, said second layers having an index of refraction different from said third layers, said second and third layers alternating, and each of said third layers having different thicknesses compared to the other of said third layers, said third layers comprising at least a pair of layers comprising a same material and different thicknesses; and
        a reflective layer on the topmost of said second and third layers.

2. The LED chip of claim 1, wherein said first layer has a thickness at least four times greater than said second and third layers.

3. The LED chip of claim 1, wherein said first layer has a thickness at least three times greater than said second and third layers.

4. The LED chip of claim 1, wherein said first layer provides a reflectivity viewing angle cut-off above which said composite layer reflectivity is approximately 100%.

5. The LED chip of claim 4, wherein said second and third layers provide improved reflectivity below said viewing angle cut-off compared to a composite layer without said second and third layers.

6. The LED chip of claim 1, wherein said one or more second layers comprises two layers having different thicknesses.

7. The LED chip of claim 1, wherein said one or more second layers comprises one layer between said plurality of third layers.

8. The LED chip of claim 1, wherein said composite layer comprises an angle averaged reflectivity greater than a quarter wavelength distributed Bragg reflector having the same number of layers.

9. The LED chip of claim 1, further comprising conductive vias through said composite layer.

10. The LED chip of claim 1, further comprising a current spreading layer to spread current passing through said composite layer.

11. The LED chip of claim 1, wherein said one or more second layers and said plurality of third layers comprise incomplete second and third layer pairs.

12. The LED chip of claim 1, wherein said composite layer is internal to said LED chip.

13. The LED chip of claim 1, wherein said composite layer is on an external surface of said LED chip.

14. The LED chip of claim 1, wherein said active layer emits blue light and wherein said first layer has a thickness in the range of 500 to 650 nm.

15. The LED chip of claim 1, wherein said active layer emits blue light and wherein said one or more second layers comprise two layers having a thickness in the range of 100 to 120 nm and approximately 40 to 60 nm respectively.

16. The LED chip of claim 1, wherein said active layer emits blue light and wherein said third layers comprise two layers having a thickness in the range of 55 to 75 nm and 35 to 55 nm, respectively.

17. The LED chip of claim 1, wherein said first layer and said one or more second layers comprise $SiO_2$.

18. The LED chip of claim 1, wherein said third layers comprise $TiO_2$ or $Ta_2O_5$.

19. A light emitting diode (LED) chip, comprising:
a submount with an LED mounted to said submount; and
a composite high reflectivity layer arranged between said submount and said LED to reflect LED light, said composite layer comprising a plurality of layers and a conductive path through said composite layer through which an electrical signal can pass to said LED, said plurality of layers comprising at least a pair of layers comprising a same material and different thicknesses.

20. The LED chip of claim 19, wherein said composite layer comprises a first layer, a one or more second layers and a plurality of third layers on said first layer, said second layers having an index of refraction different from said third layers, said composite layer further comprising a reflective layer on the topmost of said second and third layers.

21. The LED chip of claim 20, wherein said one or more second layers and said plurality of third layers comprise incomplete second and third layer pairs.

22. The LED chip of claim 20, wherein said plurality of third layers comprises two third layers and said one or more second layers comprises one layer sandwiched between said two third layers.

23. The LED chip of claim 20, wherein said composite layer further comprises a reflective layer on the topmost surface of the alternating second and third layers.

24. The LED chip of claim 20, wherein said second and third layers alternate on said first layer.

25. The LED chip of claim 20, wherein each of said third layers has a different thickness compared to other of said third layers.

26. The LED chip of claim 20, wherein said one or more second layers comprise two layers, each having a different thickness compared to the other of said second layers, and each of said second layers alternating with said third layers.

27. The LED chip of claim 20, wherein said first layer has a thickness at least four times greater than said second and third layers.

28. The LED chip of claim 20, wherein said first layer has a thickness at least three times greater than said second and third layers.

29. The LED chip of claim 19, wherein said composite layer provides higher reflectivity to the wavelength of light emitted from said LED compared to a distributed Bragg reflector.

30. The LED chip of claim 19, wherein said composite layer provides an angle averaged reflectivity greater than a quarter wavelength distributed Bragg reflector having the same number of layers.

31. The LED chip of claim 19 wherein said conductive path comprises conductive vias through said composite layer.

32. The LED chip of claim 19, wherein said conductive path comprises a conductive grid through said composite layer.

33. The LED chip of claim 19, wherein said first layer and said one or more second layers comprise $SiO_2$.

34. The LED chip of claim 19, wherein said third layers comprise $TiO_2$ or $Ta_2O_5$.

35. A light emitting diode (LED) chip, comprising:
an LED comprising an active region; and
a composite high reflectivity layer integral to said LED to reflect light emitted from said active region, said composite layer comprising a first layer, and alternating second and third layers on said first layer, said second and third layers having a different index of refraction, and said first layer being at least three times thicker than the thickest of said second and third layers, said third layer comprising at least a pair of layers comprising a same material and different thicknesses.

36. The LED chip of claim 35, further comprising a reflective layer on the topmost of said second and third layers.

37. The LED chip of claim 35, wherein said first layer has the same index of refraction as said second layers.

38. The LED chip of claim 35, wherein each of said second layers has a different thickness compared to the others of said second layers.

39. The LED chip of claim 35, wherein each of said third layers has a different thickness compared to the others of said third layers.

40. The LED chip of claim 35, wherein said second and third layers comprise incomplete second and third layer pairs.

41. A method for fabricating a light emitting diode (LED) chip, comprising:
forming an LED;
depositing a composite high reflectivity layer on said LED, said composite layer comprising a plurality of layers, wherein said plurality of layers comprise at least a pair of layers comprising a same material and different thicknesses;
forming conductive vias through said composite layer to said LED;
mounting said LED to a submount with said composite layer between said LED and said submount; and
depositing contacts;
comprising a plurality of layers and a conductive path through said composite layer through which an electrical signal can pass to said LED, said plurality of layers comprising at least a pair of layers comprising a same material and different thicknesses.

42. A light emitting diode (LED) chip, comprising:
an LED; and
a composite high reflectivity layer integral to said LED to reflect light emitted from said LED, said composite layer comprising a first layer, and one or more second layers and a plurality of third layers on said first layer, said second and third layers comprising incomplete second and third layer pairs, said third layers comprising at least a pair of layers comprising a same material and different thicknesses.

43. The LED chip of claim 42, wherein said one or more second layers comprise one second layer sandwiched between said third layers.

44. The LED chip of claim 42, wherein said one or more second layers and said third layer have a different index of refraction, and said first layer is at least three times thicker than the thickest of said second and third layers.

45. The LED chip of claim 42, further comprising a reflective layer on the topmost surface of said second and third layers.

46. The LED chip of claim 1 wherein said pair of layers comprises a same index of refraction.

47. The LED chip of claim 19 wherein said pair of layers comprises a same index of refraction.

48. The LED chip of claim 35 wherein said pair of layers comprises a same index of refraction.

49. The method of claim 41 wherein said composite layer comprises a plurality of layers, said plurality of layers comprising at least a pair of layers comprising a same material and different thicknesses.

50. The method of claim 49 wherein said pair of layers comprises a same index of refraction.

51. The LED chip of claim 42 wherein said pair of layers comprises a same index of refraction.

* * * * *